United States Patent [19]

Seiler

[11] 4,267,633
[45] May 19, 1981

[54] METHOD TO MAKE AN INTEGRATED CIRCUIT WITH SEVERABLE CONDUCTIVE STRIP

[75] Inventor: Hartmut Seiler, Reutlingen, Fed. Rep. of Germany

[73] Assignee: Robert Bosch GmbH, Stuttgart, Fed. Rep. of Germany

[21] Appl. No.: 814

[22] Filed: Jan. 4, 1979

Related U.S. Application Data

[62] Division of Ser. No. 799,246, May 23, 1977, abandoned.

[30] Foreign Application Priority Data

Jun. 4, 1976 [DE] Fed. Rep. of Germany ....... 2625089

[51] Int. Cl.³ ..................... H01L 21/28; H01L 23/48
[52] U.S. Cl. ........................................ 29/578; 29/584; 29/590; 29/591; 148/187; 357/51; 357/59; 357/68; 357/71
[58] Field of Search ................ 29/578, 590, 591, 584; 357/51, 68, 59, 71; 148/187

[56] References Cited

U.S. PATENT DOCUMENTS

| | | | |
|---|---|---|---|
| 3,484,341 | 12/1969 | Devitt | 357/71 X |
| 3,553,830 | 1/1971 | Jenny et al. | 29/574 |
| 3,564,354 | 2/1971 | Aoki et al. | 357/51 X |
| 3,699,395 | 10/1972 | Boleky | 357/51 X |
| 3,778,886 | 12/1973 | Shields et al. | 29/584 X |
| 3,792,319 | 2/1974 | Tsang | 357/59 |
| 3,930,304 | 1/1976 | Keller et al. | 29/584 X |

OTHER PUBLICATIONS

Warner et al., *Integrated Circuits*, Textbook, McGraw-Hill, 1965, p. 134.

*Primary Examiner*—R. Dean
*Assistant Examiner*—W. G. Saba
*Attorney, Agent, or Firm*—Frishauf, Holtz, Goodman & Woodward

[57] ABSTRACT

To render severing of electrical conductors on integrated circuit (IC) chips more reliable, the region of insulating material, typically silicon oxide, beneath the zone which is to be severed, is increased in thickness; the increase in thickness is, preferably, in stepped form, so that the heat capacity at the point of severing of the conductor is less than the heat dissipation at other regions of the conductor, and especially at the point of application of the current probes. Preferably, the contact points at which the current probes are applied are located directly on the semiconductor surface without any intervening insulating oxide layer.

2 Claims, 2 Drawing Figures

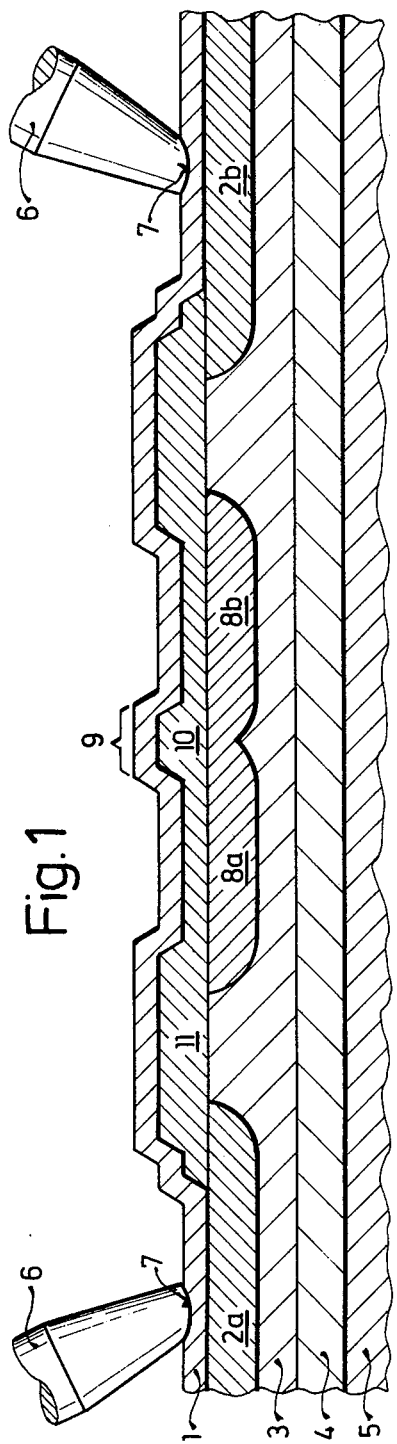
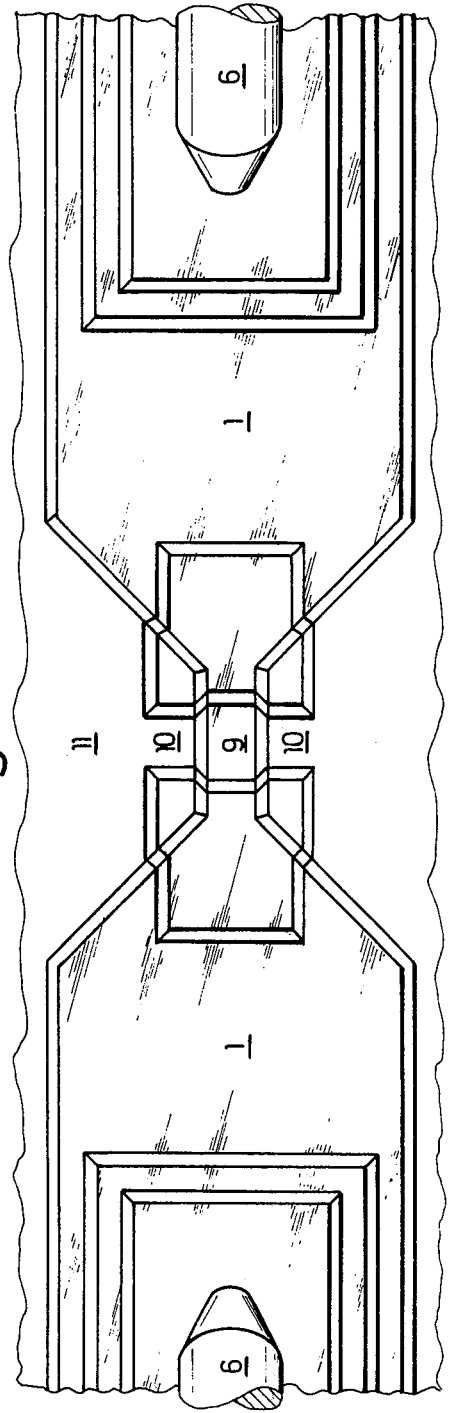

METHOD TO MAKE AN INTEGRATED CIRCUIT WITH SEVERABLE CONDUCTIVE STRIP

This is a division of application Ser. No. 799,246, filed May 23, 1977, now abandoned.

Reference to prior art: German Publication Paper DT-AS No. 1,902,369. and corresponding U.S. Pat. No. 3,553,830 U.S. Pat. No. 3,930,304.

The present invention relates to an arrangement to sever conductive strips on semiconductor chips on which integrated circuits have been made, and more particularly to severing conductive strips by vaporization upon application of electrical current to such strips applied to an insulating layer of silicon oxide to a silicon chip.

BACKGROUND AND PRIOR ART

Monolithic integrated electronic circuits and networks made by planar technology are usually connected by conductive strips. To permit selective removal of circuit elements, for example resistors, from the integrated circuit, conductive strips should be removable after the integrated circuit (IC) has been made. One arrangement of this type is described in U.S. Pat. No. 3,553,830 in which probes are applied to conductive strips, and current passed through the probes to vaporize the conductive strip between the probes. This arrangement has difficulties since the transition resistance of the conductive probes to the metallized conductive strip is often a multiple of the resistance of the severing portion due to the low cross-sectional area of the contact point between the probes and the conductive strip. For this reason, substantially more electrical energy is frequently transferred into heat at the contact point between the probes and the conductive strip than at the point where the metallization is intended to be severed.

THE INVENTION

It is an object of the present invention to provide an arrangement in which the conductive strip will be severed reliably at a predetermined position, where intended.

Briefly, the chip is formed, as customary, with an oxidizing layer, typically a silicon chip with silicon oxide. The conductive strip is then applied over the silicon oxide. In accordance with the invention, that region of the silicon oxide which is beneath the severing location of the conductive strip is increased in thickness; preferably, the increase is in step form. The increased thickness of the insulating material, typically silicon oxide, forms a zone beneath the conductive strip which has a lesser heat capacity than the heat dissipation and conduction heat capacity as well as the heat sink capacity of the conductive strip at the point of applicaton of the probes. Thus, heat conduction away from the point of severing, and heat capacity of the conductive strip at that location is decreased with respect to the remainder thereof.

In accordance with a preferred feature of the invention, the conductive strip is directly applied to the semiconductor surface in the zones where the probes which apply the vaporization or burning-off current are to be applied.

DRAWINGS

Illustrating an example:

FIG. 1 is a highly schematic fragmentary cross-sectional view, to an enlarged scale, of an integrated circuit and showing, in cross section, a conductive strip which is to be severed; and FIG. 2 is a top view of the arrangement of FIG. 1.

The portion of a monolithic IC is placed on a single crystal silicon substrate 5 having an epitaxial layer 3 located thereon, which is grown on the substrate. A conductive zone 4 is diffused into the chip. The top side of the substrate 5, the conductive zone 4 and the epitaxial layer 3 form a semiconductor chip which is partly covered with a layer of silicon oxide 11, in accordance with predetermined masking. A conductive strip 1 is applied in a suitable geometric arrangement to the composite chip formed of the substrate 5 and layers 3, 4 and 11. The conductive strip 1 forms a portion of the connecting conductors in the form of metallized connection strips of the IC.

On the arrangement shown, the metal strip 1 is to be severed at the location 9. At that point, the metal strip 1 is reduced in width.

In accordance with the invention, the thickness of the silicon oxide layer 11 at the location 9 of the strip is increased as seen at 10. This increase is in step form (FIG. 1). Since the region 9 of the conductive strip 1 extends at the surface of the silicon oxide layer 11 and up the step-like projection 10, the conductive strip 1 will extend at an inclination in the region 9 to carry it up and over the projection or thickened portion 10 of the oxide layer. Upon application of current to the strip 1 by probes 6, the vaporizing current will generate higher heat losses per unit area over the increased or thickened portion 10 than at the region of the conductive strip 1 which is in a single plane. Additionally, the thermal resistance is increased beneath the location 9 in relation to the thickness of the oxide. As a consequence, only the metal on the thickened portion 10 will melt and thus sever the strip only at that location. This is of substantial advantage, particularly if the conductive strips have to carry a fair amount of current and thus are designed to be comparatively wide. The quantity of the metal which has to be melted off is substantially less than when the conductors are carried over a flat oxide surface. The danger of metal spattering is also substantially decreased.

The heat conduction can be further improved, and the heat capacity increased by placing the conductive strip 1 in the region of application of probes 6 not on an oxide layer 11, but rather directly on the semiconductor surface. The heat conductivity of silicon is approximately 100 times greater than that of silicon oxide. Thus, even if comparatively wide conductive strips are to be severed, the metal will not melt beneath the point of application of the probe 6.

The stepped thickening 10 of the silicon oxide layer 11 can be made in the customary IC planar technology simultaneously with the base diffusion, by locating two immediately adjacently positioned diffusion zones 8a, 8b in the epitaxial layer 3, the zones 8a, 8b being doped to form transistor bases so that they will be of conductivity type opposite that of the substrate. The zones 8a, 8b can be located so close to each other that, after diffusion, they merge into a single region of the same conductivity. It is only necessary to leave a small zone at location 9 which will form the thickened oxide portion 10, in form of a stepped increase of silicon oxide 11 which results upon diffusion and the etching of the base zones 8a, 8b. The small portion 10 will be above the region where the two zones 8a, 8b fit against or merge into each other. This stepped, thickened oxide portion 10 must remain above the adjacent or merged zones 8a, 8b.

The conductive strip 1 usually should not have any contact with the trough material below, or at most only a single contact. The conductive strips, however, are directly applied to the silicon. Thus, to prevent ohmic connection between conductive strip 1 and the epitaxial layer 3 outside of the layer 11, the contact points 7 beneath the probes 6 also have doping material introduced therein of the same conductivity as the doping of the bases. These zones 2a, 2b, beneath the probe contact points 7, are separated from each other. After diffusing the base-doping zones 2a, 2b into the silicon, the zones do not contact each other, nor do they have any contact with the thickened oxide bridge 10.

Various changes and modifications may be made within the scope of the inventive concept.

The silicon oxide layer 11 on the average has a thickness of 1 μm; the thickened portion 10 is about twice as thick as the average of layer 11. The conductive strip 9 is also substantially narrowed immediately above the thickened bridge 10. FIGS. 1 and 2 are drawn in vertical alignment to show the relationship of conductive layer 1 and silicon oxide layer 11.

I claim:

1. Method to make an integrated circuit by planar technology having a metallic strip (1) adapted to be severed at a predetermined location (9) on the surface area of the chip by application of electrical current to said strip.

comprising the steps of providing a silicon substrate chip (3, 4, 5);

forming a zone of lesser heat dissipation capacity than surrounding areas at said predetermined location beneath the metallic strip to provide a burn-out point at said predetermined location including forming a layer (11) of silicon oxide on said substrate chip of increased thickness with respect to surrounding areas at said predetermined location by utilizing a masking pattern having two windows adjacent said predetermined location (9) while leaving a bridge at said location between said two windows, and diffusing doping material into said chip into the zones of said windows to form diffusion zones (8a, 8b) in said chip adjacent to and beneath said predetermined location (9) and forming a covering silicon oxide layer (11) at said diffusion zones (8a, 8b) and over said bridge of silicon oxide whereby the silicon oxide bridge will have a thickened portion (10) with respect to the adjacent areas of the silicon oxide layer (11);

and applying a metallic conductive layer (1) in strip form over the silicon oxide layer located over said diffusion zones (8a, 8b) and over said thickened portion (10), to provide said zone of lesser heat dissipation capacity at said location (9) than the heat dissipation capacity of the oxide layer (11) in areas surrounding said predetermined location.

2. Method according to claim 1, further including the step of forming good heat conductive connecting regions for application of electrical current to the metallic conductive layer (1), comprising the steps of forming two non-surface oxidized additional diffusion zones (2a, 2b) of conductivity opposite to that of the substrate chip positioned remote from said diffusion zones (8a, 8b) adjacent to and beneath said predetermined location (9);

and the step of applying said conductive metallic material includes the step of extending the conductive strip-like material over said additional diffusion zones (2a, 2b) of said opposite conductivity type to permit application of said metallic conductive layer (1) directly to the silicon of the chip on said additional diffusions zones (2a, 2b) formed on the substrate while effectively electrically isolating the metallic conductive layer (1) from the substrate and said diffusion zones (8a, 8b) adjacent to and beneath said predetermined location (9).

* * * * *